United States Patent
Krishnamurthy et al.

(10) Patent No.: US 11,823,708 B1
(45) Date of Patent: Nov. 21, 2023

(54) HAMR RECORDING HEAD WITH EXTERNAL CAVITY LASER USING A NEAR-FIELD TRANSDUCER AS A REFLECTOR

(71) Applicant: Seagate Technology LLC., Fremont, CA (US)

(72) Inventors: Vivek Krishnamurthy, Edina, MN (US); Scott Eugene Olson, Eagan, MN (US); Tyler Lenn Perry, Cottage Grove, MN (US); John Charles Duda, Bloomington, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/877,478

(22) Filed: Jul. 29, 2022

Related U.S. Application Data

(63) Continuation of application No. 16/943,124, filed on Jul. 30, 2020, now Pat. No. 11,437,068.

(60) Provisional application No. 62/880,195, filed on Jul. 30, 2019.

(51) Int. Cl.
  *G11B 11/105* (2006.01)
  *G11B 5/00* (2006.01)
  *G11B 13/08* (2006.01)
  *H01S 5/14* (2006.01)
  *H01S 5/028* (2006.01)
  *H01S 5/0683* (2006.01)
  *H01S 5/12* (2021.01)

(52) U.S. Cl.
  CPC ............ *G11B 13/08* (2013.01); *H01S 5/028* (2013.01); *H01S 5/06837* (2013.01); *H01S 5/1215* (2013.01); *H01S 5/141* (2013.01); *G11B 2005/0021* (2013.01)

(58) Field of Classification Search
  CPC ....... G11B 13/08; G11B 13/04; G11B 5/4826; G11B 5/6088; G11B 11/24; G11B 2005/0021; G11B 5/012; G11B 7/126; G11B 5/3133; G11B 5/4866; G11B 7/12; G11B 5/39; G11B 11/10; G11B 11/105; G11B 5/127; G11B 5/6047; G11B 11/10506; G11B 11/10501
  USPC .......................................... 360/59; 369/13.33
  See application file for complete search history.

(56) References Cited

U.S. PATENT DOCUMENTS

| | | | |
|---|---|---|---|
| 5,870,417 A | 2/1999 | Verdiell et al. | |
| 9,331,454 B2* | 5/2016 | Kondo | H01S 5/02251 |
| 9,960,570 B1 | 5/2018 | Goggin et al. | |
| 2015/0364899 A1* | 12/2015 | Tatah | G11B 5/6088 372/20 |

* cited by examiner

Primary Examiner — Nabil Z Hindi
(74) Attorney, Agent, or Firm — Mueting Raasch Group

(57) ABSTRACT

An external cavity laser of a recording head includes a channel waveguide that delivers light towards a media-facing surface of the recording head. The laser includes an externally mounted part with an active region having a longitudinal axis corresponding to a light propagation direction of the channel waveguide. The externally mounted part has a reflective back facet and anti-reflective front facet. The laser includes a near-field transducer at an end of the channel waveguide proximate the media facing surface. The reflective back facet and the near-field transducer define a resonator of the external cavity laser.

19 Claims, 14 Drawing Sheets

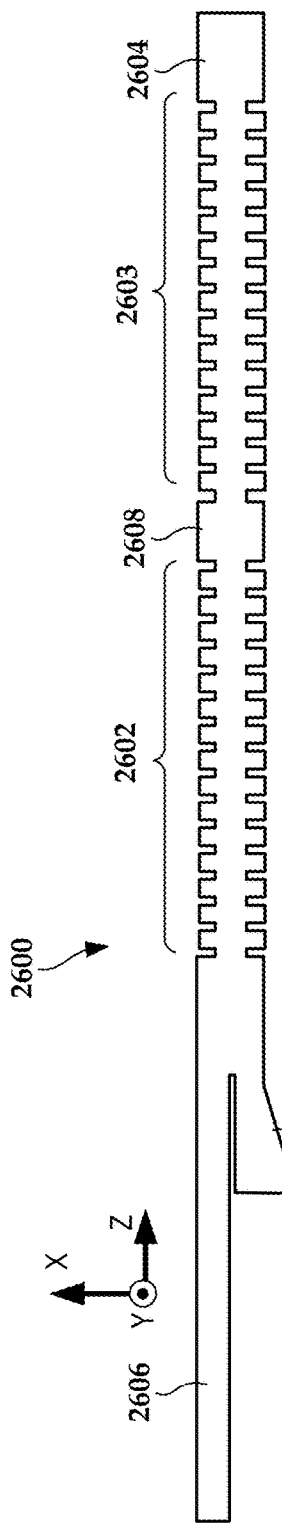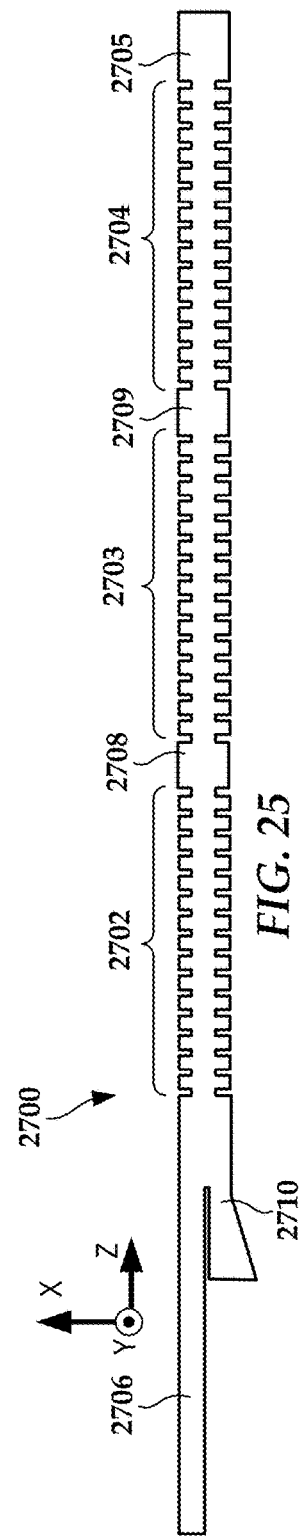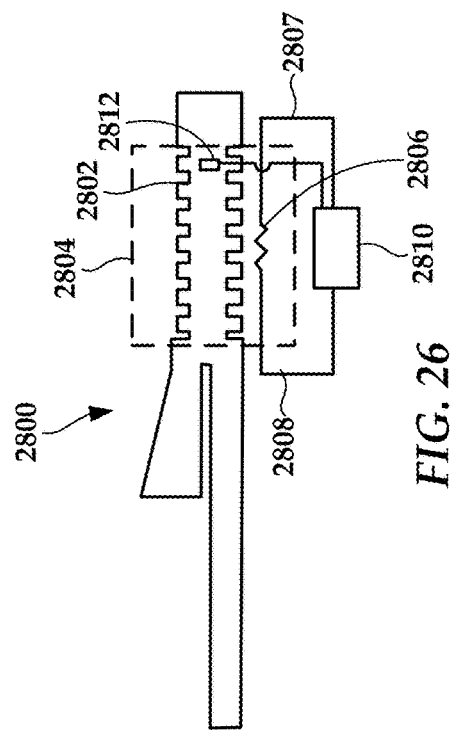

US 11,823,708 B1

HAMR RECORDING HEAD WITH EXTERNAL CAVITY LASER USING A NEAR-FIELD TRANSDUCER AS A REFLECTOR

RELATED PATENT DOCUMENTS

This application is a continuation of U.S. application Ser. No. 16/943,124, filed on Jul. 30, 2020, which claims the benefit of U.S. Provisional Application No. 62/880,195, filed on Jul. 30, 2019, all of which are incorporated herein by reference in their entireties.

SUMMARY

The present disclosure is directed to a recording head with an external cavity laser. In one embodiment, an external cavity laser of a recording head includes a channel waveguide that delivers light towards a media-facing surface of the recording head. The laser includes an externally mounted part with an active region having a longitudinal axis corresponding to a light propagation direction of the channel waveguide. The externally mounted part has a reflective back facet and anti-reflective front facet. The laser includes a near-field transducer at an end of the channel waveguide proximate the media facing surface. The near-field transducer has a plate structure and a peg extending from the plate structure towards the media-facing surface. The reflective back facet and the near-field transducer define a resonator of the external cavity laser.

In another embodiment, an external cavity laser of a recording head includes a channel waveguide that delivers light towards a media-facing surface of the recording head. The laser includes an externally mounted part with an active region having a longitudinal axis corresponding to a light propagation direction of the channel waveguide. The externally mounted part has a reflective back facet and anti-reflective front facet. The laser includes a near-field transducer at an end of the channel waveguide proximate the media facing surface. The laser includes a Bragg grating within the channel waveguide and having a longitudinal axis defined along the light propagation direction. The Bragg grating is separated from the near-field transducer by 5 µm or less.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

FIGS. 24 and 25 are diagrams of Bragg gratings according to other example embodiments;

FIG. 26 is a diagram of a heater used with a Bragg grating according to an example embodiment.

DETAILED DESCRIPTION

The present disclosure is generally related to heat-assisted magnetic recording (HAMR), also referred to as energy-assisted magnetic recording (EAMR), thermally-assisted recording (TAR), thermally-assisted magnetic recording (TAMR), etc. In a HAMR device, a near-field transducer (NFT) concentrates optical energy into a tiny optical spot in a recording layer, which raises the media temperature locally, reducing the writing magnetic field required for high-density recording. A waveguide delivers light to the NFT which achieves surface plasmon resonance. This generates surface plasmon polaritons that are directed to the recording medium which results in a hotspot in the recording layer.

Currently, a laser (e.g., laser diode) is used to provide the optical energy used to heat the HAMR recording medium. Lasers can be manufactured at very small scale (e.g., micrometer scale) yet provide the energy needed to heat the recording medium. One issue seen with conventional lasers (e.g., lasers in single package) is laser instability. A HAMR head doesn't have an optical isolator between the laser and NFT. The NFT, typically being made of a plasmonic metal such as Au, also reflects a significant amount of light, resulting in an optical feedback signal from NFT. This feedback signal fluctuates between low and high, as it interferes with signal in the laser cavity. So, as temperature varies and shifts laser wavelength, emitted power from laser also fluctuates between low and high as a consequence of feedback signal. This fluctuating laser power can occasionally make the laser unstable, causing variation in optical power delivered to the NFT. The variation in optical power leads to variations in bit-error rate (BER) and hence undercuts areal density margin.

In the present disclosure, a channel waveguide integrated into a recording head is made part of the laser cavity. The channel waveguide may incorporate a Bragg reflector along the light path close to NFT, or the NFT may serve by itself as the reflector. The reflector and NFT are closely spaced such that they may function substantially as a single optical entity. In such an arrangement, the feedback signal from NFT has negligible effect, at least over the temperature range of interest. Hence laser power is stable in such an arrangement.

Figure 1:
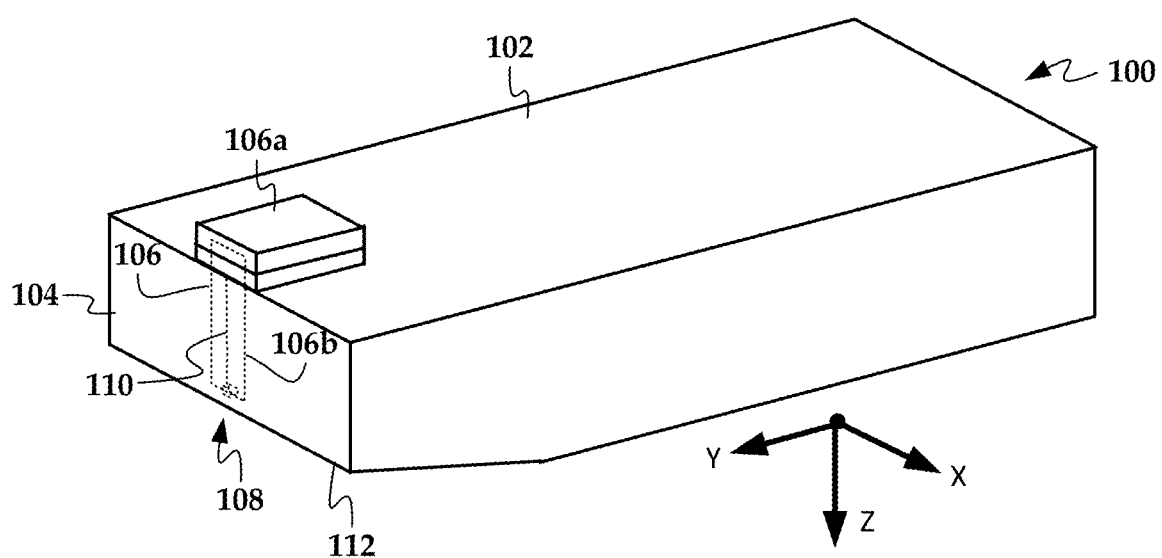
FIG. 1 is a perspective view of a slider assembly according to an example embodiment.

In reference now to FIG. 1, a perspective view shows a recording head 100 according to an example embodiment. The recording head 100 may be used in a magnetic data storage device, e.g., HAMR hard disk drive. The recording head 100 may also be referred to herein interchangeably as a slider, head, write head, read head, read/write head, etc. The recording head 100 has a slider body 102 with read/write transducers 108 at a trailing edge 104 that are held proximate to a surface of a magnetic recording medium (not shown), e.g., a magnetic disk.

The illustrated recording head 100 is configured as a HAMR device, and so includes optical components that form a hot spot on the recording medium near the read/write transducers 108. These HAMR components include an energy source 106 a waveguide 110 (e.g., a dielectric channel waveguide) integrated into the slider body 102. Note that the energy source includes an externally mounted part 106a (e.g., that includes an active region/quantum well) and internal part 106b integrated with the waveguide 110. The energy source 106 will be referred to herein as an external cavity laser, as the resonance cavity extends beyond the externally mounted part 106a that emits the light in response to an applied electrical current. The waveguide 110, in addition to being part of the external cavity, delivers electromagnetic energy from the energy source 106 to a near-field transducer (NFT) that is part of the read/write transducers 108. The NFT achieves surface plasmon resonance and directs the energy out of a media-facing surface 112 to create a small hot spot in the recording medium.

Figure 2:
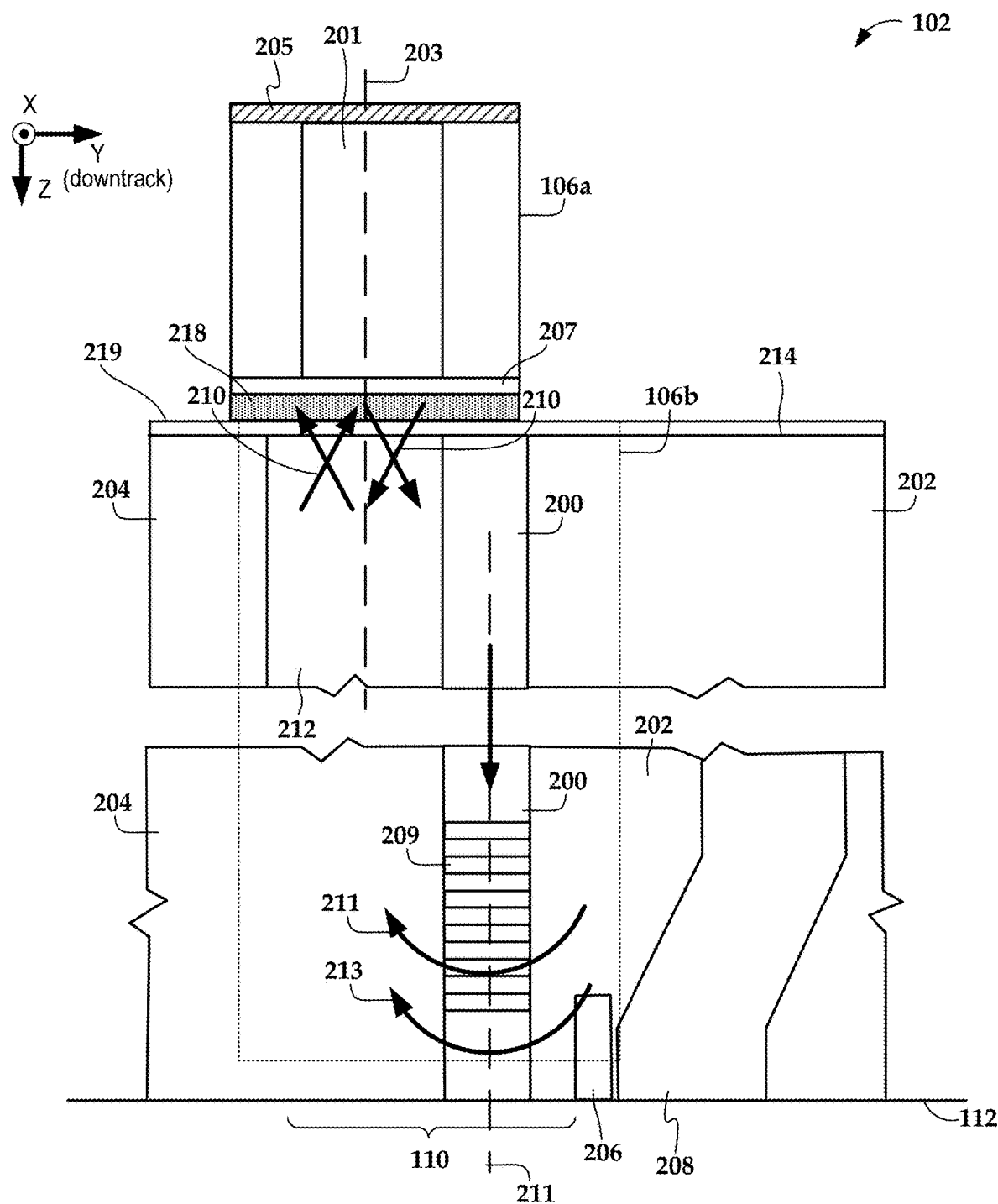
FIG. 2 is a cross-sectional view of a slider along a down-track-oriented plane according to according to an example embodiment.

In FIG. 2, a cross-sectional view show details of a slider body 102 according to an example embodiment. The waveguide 110 includes a core 200 surrounded by cladding layers 202, 204. The core 200 delivers light to an NFT 206 that is located between the core 200 and a write pole 208 (also referred to as a "magnetic pole"). A magnetic coil (not shown) induces a magnetic field through the write pole 210 in response to an applied current. During recording, the NFT 206 forms a hotspot within a recording layer of a moving recording medium (not shown). The write pole 210 sets a magnetic orientation in the hotspot, thereby writing data to the recording medium.

In this configuration, the waveguide 110 is part of the external cavity laser 106. As seen here, the externally mounted part 106a has an active region 201 (e.g., quantum well) that emits light in response to an applied current. The externally mounted part 106a has a longitudinal axis 203 that corresponds to a light propagation direction (z-direction in this example) of the channel waveguide 110. The externally mounted part 106a has a reflective back facet 205 and anti-reflective front facet 207. The slider body 102 may also have an anti-reflective layer 219 on an input surface 214 at least where light exits the externally mounted part 106a.

As seen in this view, light 210 is emitted from and reflected back to the externally mounted part 106a. The core 200 of the channel waveguide 110 may include a Bragg grating 209 with a longitudinal axis 211 defined along the light propagation direction. Note that the longitudinal axes 203, 211 of the externally mounted part 106a and the Bragg grating 209 are shown misaligned in the downtrack direction (y-direction in this example), although they may be aligned in other embodiments. The slider body 102 includes an input coupler 212 at the input surface 214 that receives the light 210 from the externally mounted part 106a and directs the light to the waveguide core 200. The input coupler 212 may work in reverse, coupling reflected light 210 from the waveguide core 200 into the externally mounted part 106a.

The Bragg grating 209 is located proximate the near-field transducer 206 so that together they can function as a single reflector, as indicated by arrows 211, 213. The reflective back facet 205 and the single reflector define a resonator of the external cavity laser 106. The Bragg grating 209 in this example includes serrations on opposing crosstrack sides of the core 200 of the channel waveguide 110. The serrations may have a variety of shapes, e.g., rectangular, curved, sinusoidal, etc., and parts of the Bragg grating 209 may include different shaped serrations, e.g., rectangular in one region and sinusoidal in another region.

It has been found with existing near-field transducer designs (e.g., a peg extending from plate structure on a substrate parallel plane, which is xz-plane in FIG. 2) that the near-field transducer can reflect up to ~0.5-15% of the light that illuminates the region near the media-facing surface 112. In some embodiments, e.g., using a laser on slider configuration as shown in FIG. 2, this amount of reflection may be sufficient to induce lasing, and so the Bragg reflector may not be needed in such a case. In other configurations, e.g., where a laser is transfer printed to a substrate parallel plane of the slider body 102, a higher amount of reflection may be needed, and so a Bragg reflector could be used in such a case to increase laser efficiency.

Also shown in FIG. 2 is an including index matching material 218 that can help increase lasing efficiency by matching a refractive index of at least one of the adjoining surfaces. The index matching material 218 may be easier to deploy in a configuration where the laser is transfer printed or otherwise formed onto the substrate parallel plane of the slider body 102. Together with one or both the anti-reflective layers 207, 219, the index matching material 218 can help ensure the external cavity laser provides sufficient power even with low reflection (e.g., 15% or less) near the media-facing surface 112.

Figure 3:
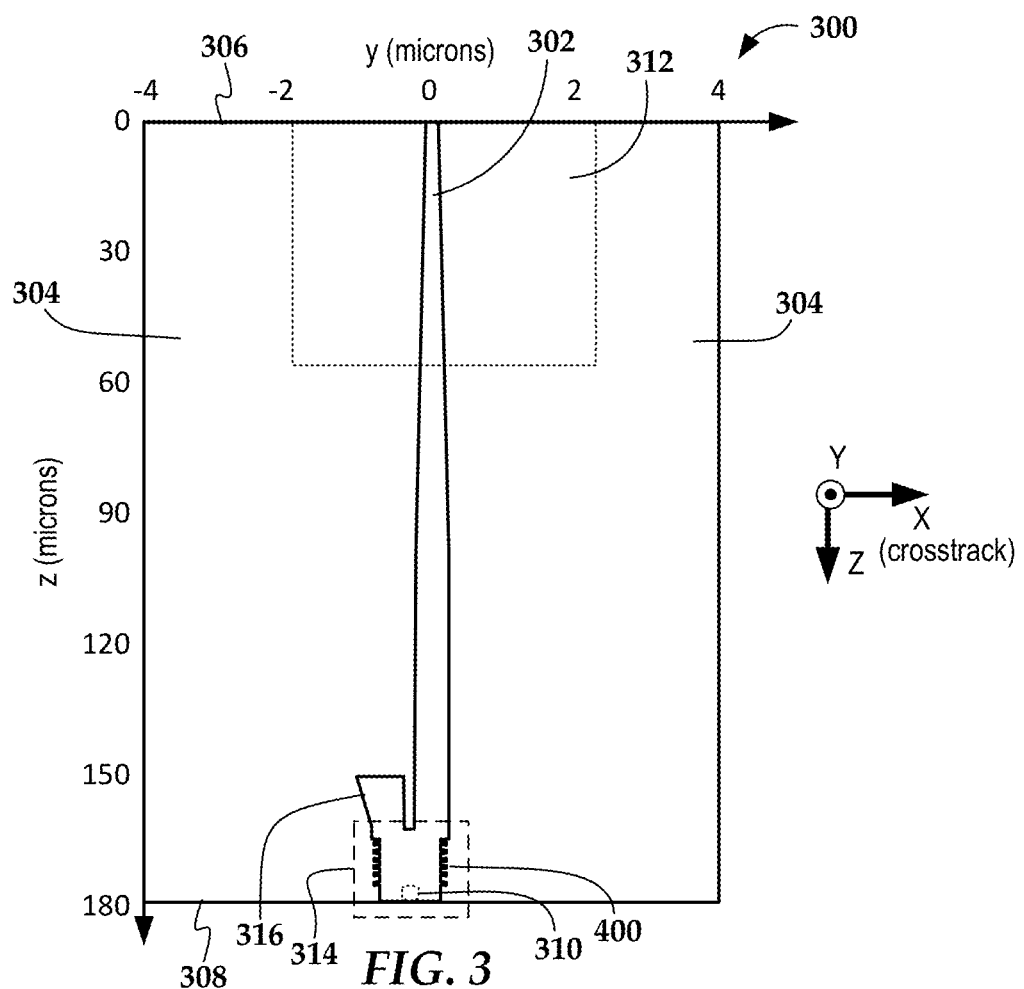
FIGS. 3 and 4 are wafer plane views of waveguide using in an external cavity laser according to an example embodiment.
Figure 4:
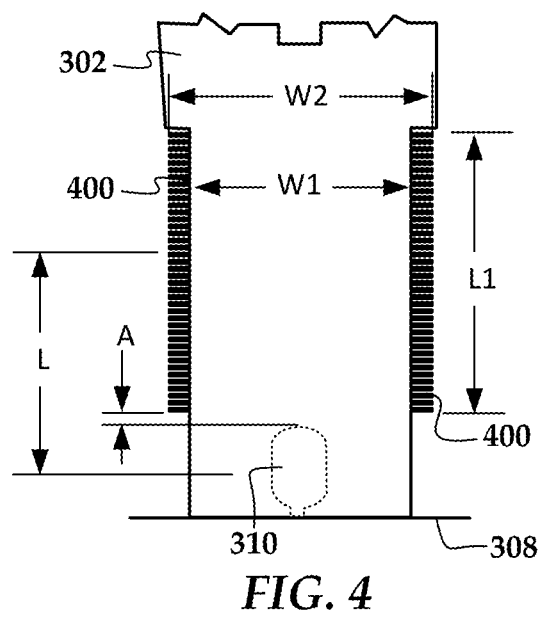

In FIGS. 3 and 4, a cross-sectional, wafer-plane view shows additional details of a waveguide 300 that may be used as part of an external cavity laser according to an example embodiment. A core 302 of the waveguide 300 is surrounded by cladding 304. The core 302 extends from a top, input surface 306 to a bottom, media-facing surface 308. An NFT 310 is located downtrack from the core 302 near the media-facing surface 308. An input coupler 312 is shown downtrack from the core 302 near the input surface 306.

The waveguide 302 includes a mode-coupler 316 that, in this example, converts light from a transverse electric (TE) fundamental mode (TE00) to a higher order mode (TE10). This mode converter 316 is configured as a branch waveguide that separates from the main path of the core above the Bragg grating 400. Other types of mode converters may be used, and in some embodiments (e.g., where the NFT 310 can use the fundamental mode) the mode converter 316 may be optional. In FIG. 4, a close up view corresponding to box 314 in FIG. 3 shows details of the Bragg grating 400. In this example, the Bragg grating 400 includes rectangular serrations that are regularly spaced. The bottom end of the Bragg grating 400 (facing the surface 308) is separated from a top edge of the NFT 310 by distance A, although in some embodiments A may be zero or the NFT 310 may overlap the grating 400 in the z-direction.

Other dimensions shown for the Bragg grating 400 include the internal crosstrack width W1 which is around 850 nm in this example. The outer width W2 of the grating 400 is about 1050 nm in this example. The length L1 of the grating is around 10-15 µm. The pitch of the grating serrations (as well as other geometric dimensions and features) will be discussed in greater detail below. This example uses a constant pitch grating 400, however the external cavity laser embodiments described herein may use more than one pitch for the grating serrations, and may use multiple sets of gratings.

Generally, while the Bragg grating 400 and NFT 310 are close enough to act as a substantially single reflector, there is still some separation between the grating 400 and NFT 310. This is generally indicated by distance L, and also represented schematically by different reflection arrows 211, 213 in FIG. 2. This separation between reflective regions can be well controlled and designed such that the chances of mode hopping are reduced.

In a conventional laser/NFT arrangement, a distance corresponding to laser output facet to the NFT, may be on the order of 150-200 µm. In contrast, the illustrated L is on the order of 5 µm or less. The mode hop spacing (which is a change in light propagation distance that is likely to induce mode hops) may be approximated by $\lambda^2/(2n_g L)$, where $\lambda$ is the wavelength of light and $n_g$ is the group index of the waveguide mode. So for the arrangement shown in FIGS. 3 and 4 where L≈5 µm, the mode hop spacing is approximately $(830\ nm)^2/(2*1.9*5000\ nm)$=36.25 nm. For the conventional arrangement with laser facet to NFT spacing on the order of 180 µm, the mode hop spacing is $(830\ nm)^2/(2*1.9*180,000\ nm)$=1 nm. By reducing L, mode-hops are much farther apart in space and hence would require a greater change in temperature for thermal expansion to induce a mode hop. By making mode hop spacing wider in temperature space, the external cavity laser arrangement shown herein will be much less sensitive to temperature than conventional arrangements.

Figure 5:
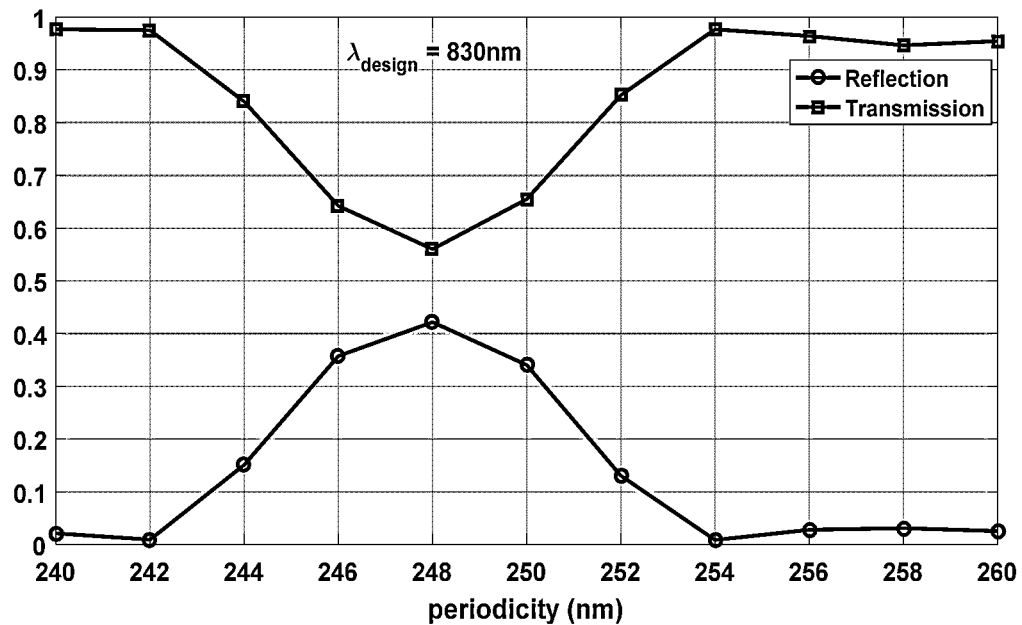
FIGS. 5, 6, 7, and 8 are graphs showing reflection and transmission of Bragg reflector gratings according to example embodiments.
Figure 6:
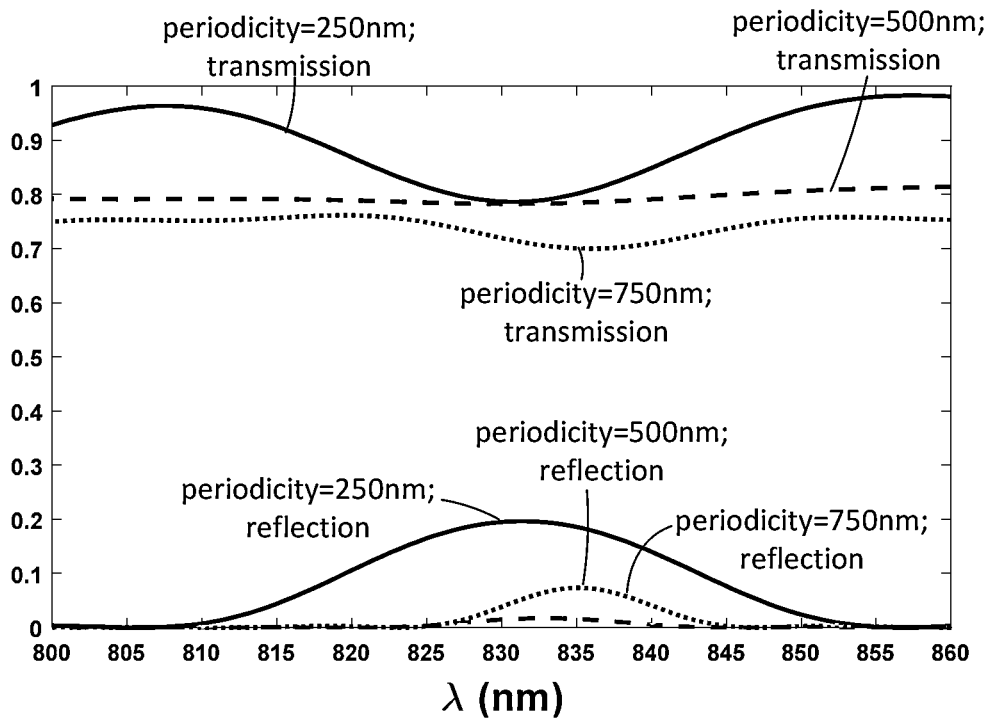

The periodicity (e.g., serration pitch) of the Bragg grating 400 is selected primarily based on the wavelength of light within the external cavity laser. In the graph of FIG. 5, a graph shows an example of transmission and reflection values for 830 nm wavelength light, wherein the maximum reflection and minimum transmission occurs at a periodicity of around 248 nm. For the arrangement illustrated in FIG. 4 where L1≈10–15 µm, a periodicity of 248 nm would result in about 40-60 serrations on each side of the waveguide core 200. The graph in FIG. 6 shows transmission values (upper curves) and reflection values (lower curves) for three different periodicities of 250 nm, 500 nm, and 750 nm. Again, this shows that periodicity of around 250 nm results in the most efficient reflector for this geometry.

Figure 7:
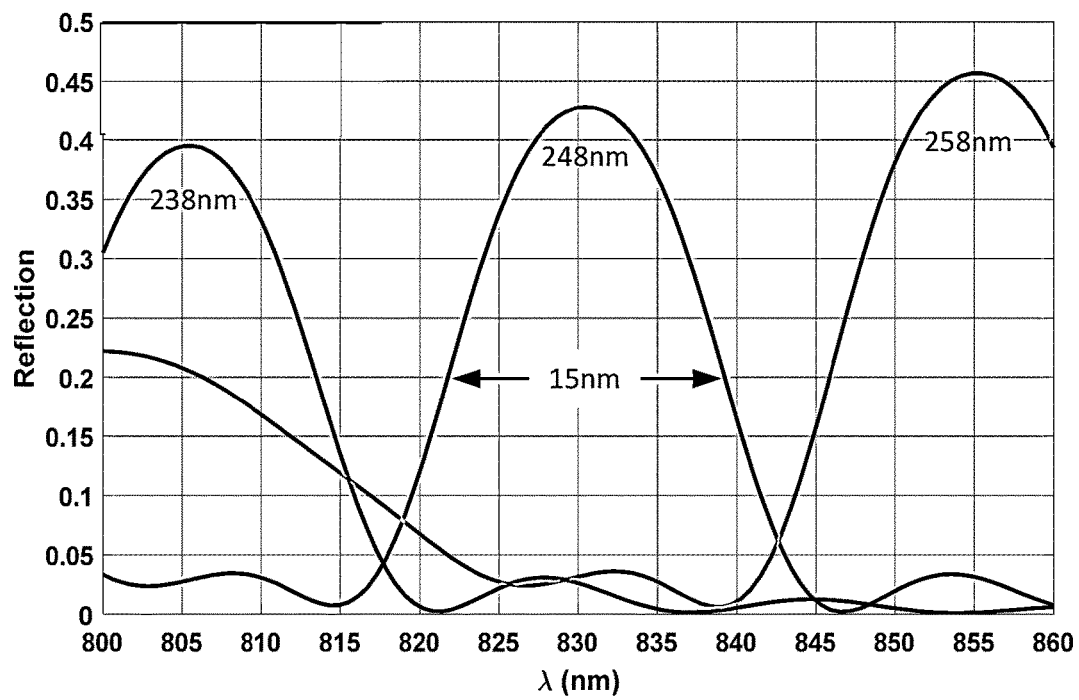

In FIG. 7, a graph shows reflection values as a function of lasing wavelength for periodicity variation of ±10 nm around the 248 nm value previously described. This shows that lasing wavelength is sensitive to periodicity; a 10 nm periodicity variation shifts lasing wavelength by 25 nm. Also note the 3 dB bandwidth of the middle curve is about 15 nm. This indicates that the reflection values remain at an acceptable level within the temperature range of interest, e.g., around 60° C.

Figure 8:
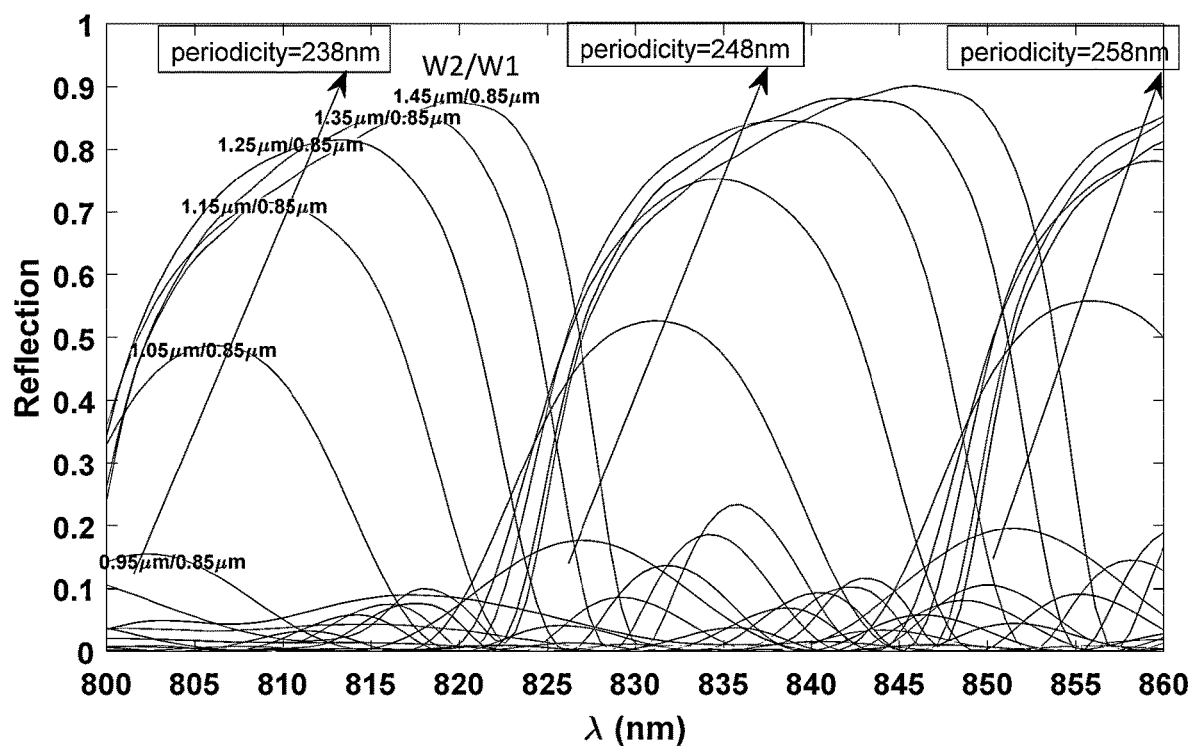

In addition to the periodicity of the grating, the depth of the serrations may be set to obtain a particular target performance. As shown in FIG. 4, the value of W1 is set to 0.85 µm. In FIG. 8, a graph shows the effect on reflection for different values of W2, ranging from 0.95 µm to 1.45 µm. This simulation was run using three different periodicity values 238 nm, 248 nm, and 258 nm. Generally, increasing the depth of the serrations or difference between W2 and W1, increases reflection and broadens the bandwidth.

Figure 9:
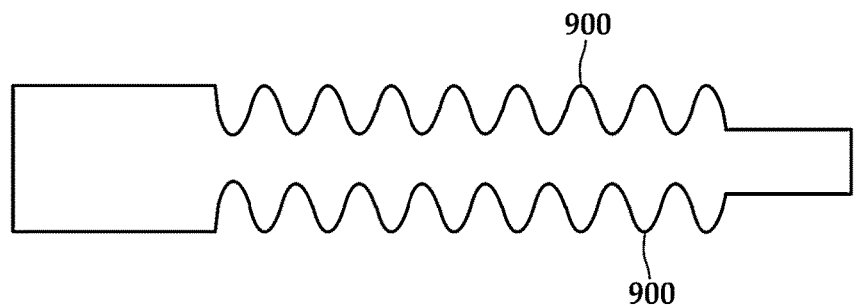
FIG. 9 is a diagram of a Bragg grating according to another example embodiment.
Figure 10:
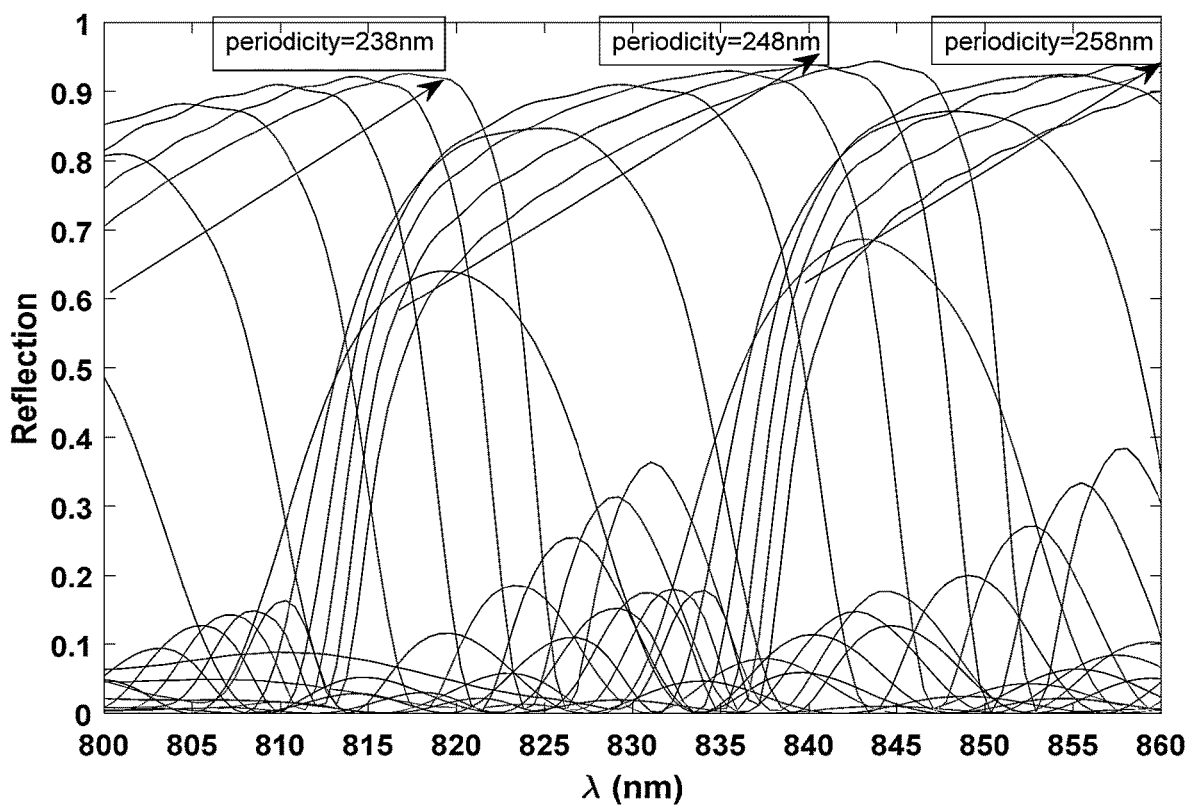
FIGS. 10 and 11 are graphs showing reflectivity of Bragg grating configurations as shown in FIG. 9.
Figure 11:
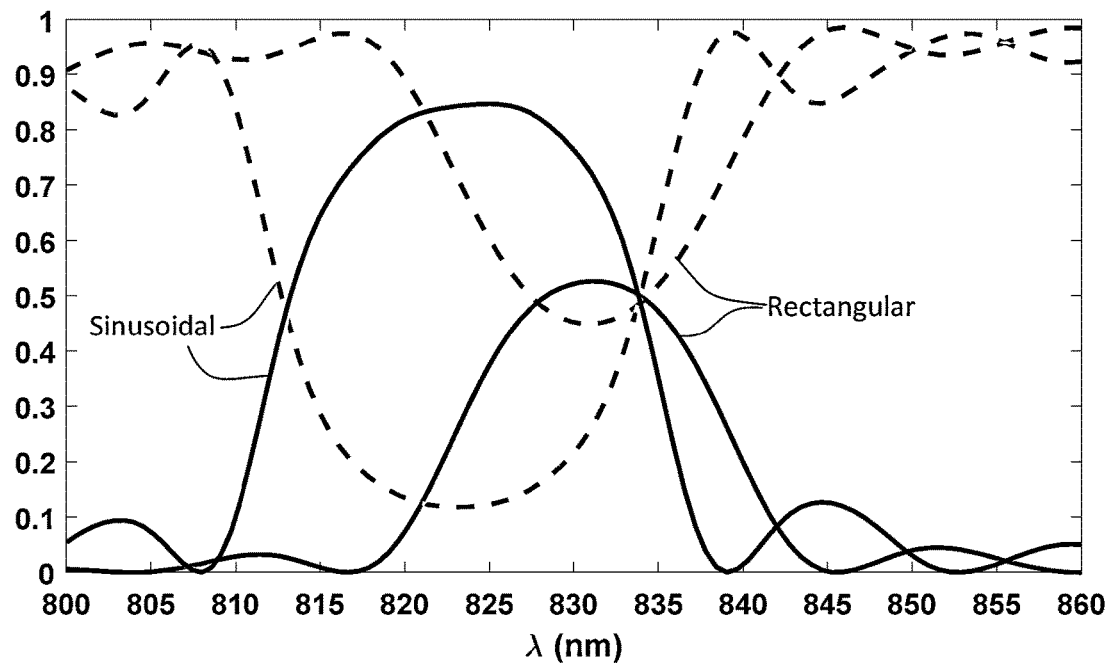

Another feature of a Bragg grating that can be varied is shape of the serrations. For example, instead of the illustrated rectangular serrations, other shapes may be used for the peaks/valleys, including triangles, trapezoids, circular arcs, parabolic curves, sinusoids, logarithmic curves, etc. In FIG. 9, a Bragg grating 900 is shown that has sinusoidal serrations. Any of the embodiments described herein may use a sinusoidal grating such as shown in FIG. 9, and this grating 900 may be implemented using periodicity and serration depth as described above. In FIG. 10, a graph shows reflection values for a sinusoidal Bragg grating for values of periodicity and serration depth analogous to the graph in FIG. 8, which showed the same values for a similarly configured rectangular grating. In FIG. 11, a graph directly compares reflection (solid lines) and transmission (dashed lines) for rectangular and sinusoidal gratings of the same geometry. Generally, the curves in FIGS. 10 and 11 show that a sinusoidal grating can exhibit broader bandwidth and have higher reflection and lower transmission values than rectangular gratings. This is because the sinusoidal serrations make the waveguide narrow and tall, making it higher index contrast and hence reflection and bandwidth increases. An advantage of sinusoidal gratings is that the sudden transitions are avoided and hence is more efficient.

Figure 12:
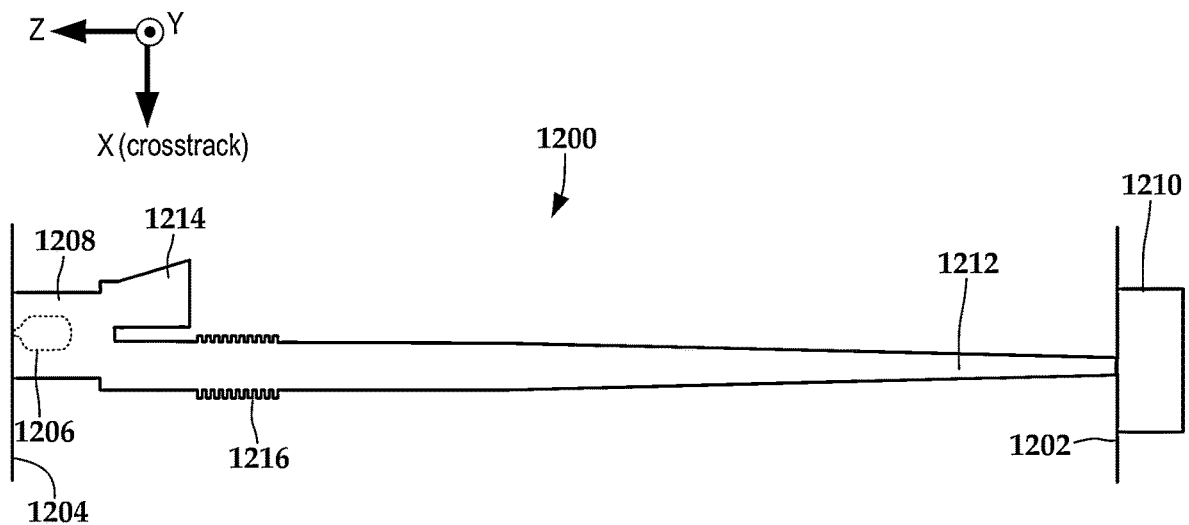
FIG. 12 is a diagram of a Bragg grating according to another example embodiment.

In some embodiments, a Bragg grating can be placed elsewhere in the light path. In FIG. 12, a diagram shows a channel waveguide assembly 1200 according to an example embodiment. The channel waveguide 1200 delivers light from an input surface 1202 to a media-facing surface 1204. A near-field transducer 1206 is at an output end 1208 of the channel waveguide 1200 and proximate to the media-facing surface 1204. The channel waveguide 1200 is part of an external cavity laser that includes an externally mounted part 1210 with an active region (not shown) having a longitudinal axis corresponding to a light propagation direction (z-direction) of the channel waveguide 1200. The externally mounted part 1210 has a reflective back facet and anti-reflective front facet (not shown), the latter being optically coupled to an input end 1212 of the channel waveguide 1200.

Figure 13:
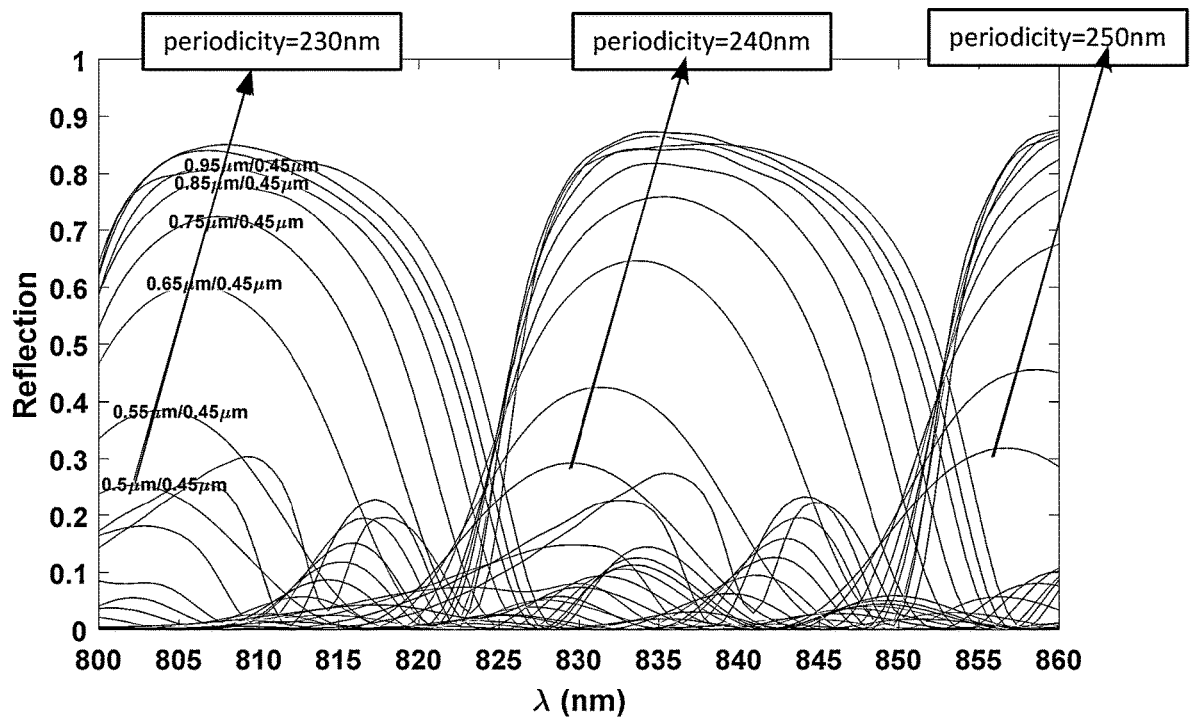
FIG. 13 is a graph showing reflectivity of Bragg grating configurations as shown in FIG. 12.

The channel waveguide 1200 includes a mode converter 1214 between the input end 1212 and the output end 1208. A Bragg grating 1216 is located within the channel waveguide between the mode converter 1214 and the input end 1212. In this example, the mode converter is a branch waveguide that converts light from TE00 mode from the input end to TE10 mode at the output end 1208. Thus, the Bragg grating 1216 is configured to reflect light in a TE00 mode. In FIG. 13, a graph shows a set of reflection values calculated for TE00 mode at different periodicities and W2/W1 values, where W1 and W2 are defined similarly as the example in FIG. 4. The TE00 has higher effective index, resulting in smaller periodicity than TE10. The TE00 reflection profile may be a little more flat than TE10. Sensitivity to center wavelength and periodicity is similar to that of TE10 gratings. Unlike the earlier Bragg reflector (e.g., shown in FIG. 3), the TE00 Bragg reflector grating 1216 may be located ~15 µm or more from the media-facing surface 1204, reducing mode-hop spacing by ~3 × compared to TE10 Bragg grating reflector that is located proximate the NFT.

Figure 14:
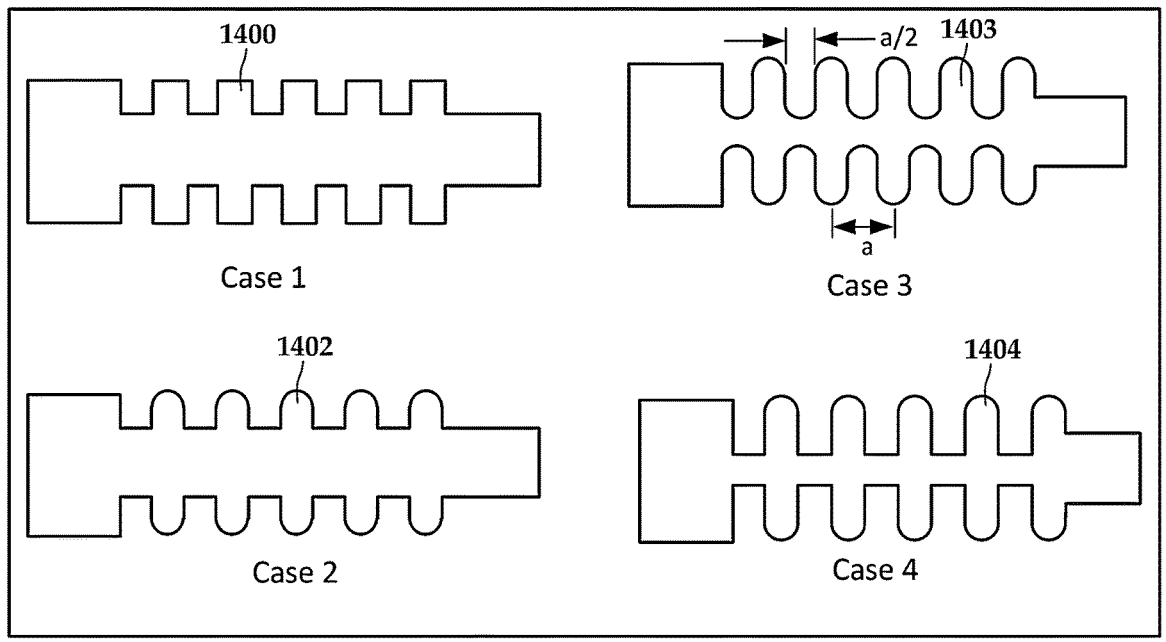
FIG. 14 is a diagram showing example process variations of a Bragg grating according to an example embodiment.

In addition to the intentional variations described above, a Bragg grating may have unintentional variation due to process variations. In FIG. 14, four grating outlines 1400-

Figure 15:
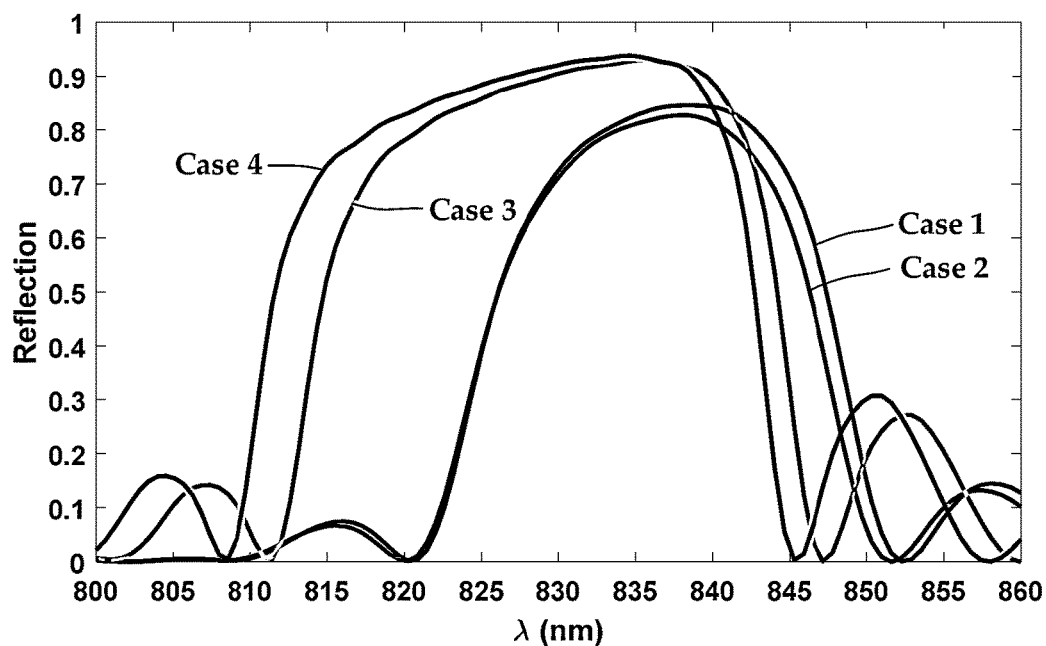
FIG. 15 is a graph showing the effects of the process variations shown in FIG. 14.

1403 indicate possible variations, where outline 1400 represents a baseline. The graph in FIG. 15 shows the effect of each variation. If the narrow part of the gratings become more narrow (cases 3 and 4), then the grating performance moves to higher reflection regime with blue shift in center wavelength. The wide part of the gratings has less effect on reflection behavior.

Figure 16:
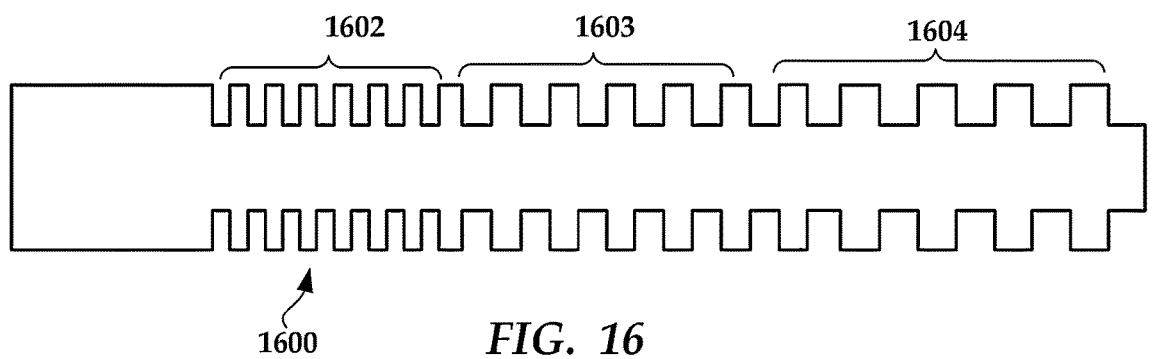
FIGS. 16 and 17 are diagrams of Bragg gratings according to other example embodiments.
Figure 17:
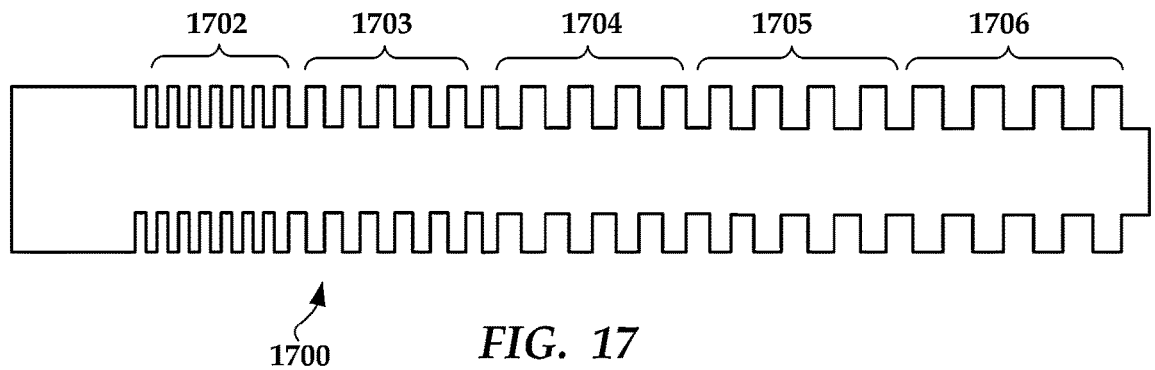

There are a number of features that may be added to a Bragg grating as described herein to lessen the impact of process variations. In FIGS. 16 and 17, diagrams illustrate Bragg gratings 1600, 1700 that can be used in an external cavity laser according to additional example embodiments. In FIG. 16, Bragg grating 1600 has three sections 1602-1604 with different serration pitch resulting in different periodicity for each section 1602-1604. In FIG. 17, grating 1700 has five sections 1702-1706 different serration pitch resulting in five different periodicities, e.g., from left to right, 244 nm, 248 nm, 253 nm, 258 nm, and 268 nm. For both of these embodiments, different serration shapes may be used, e.g., curved, sinusoidal, etc. These types of gratings 1600, 1700 may be used before or after a mode converter.

Figure 18:
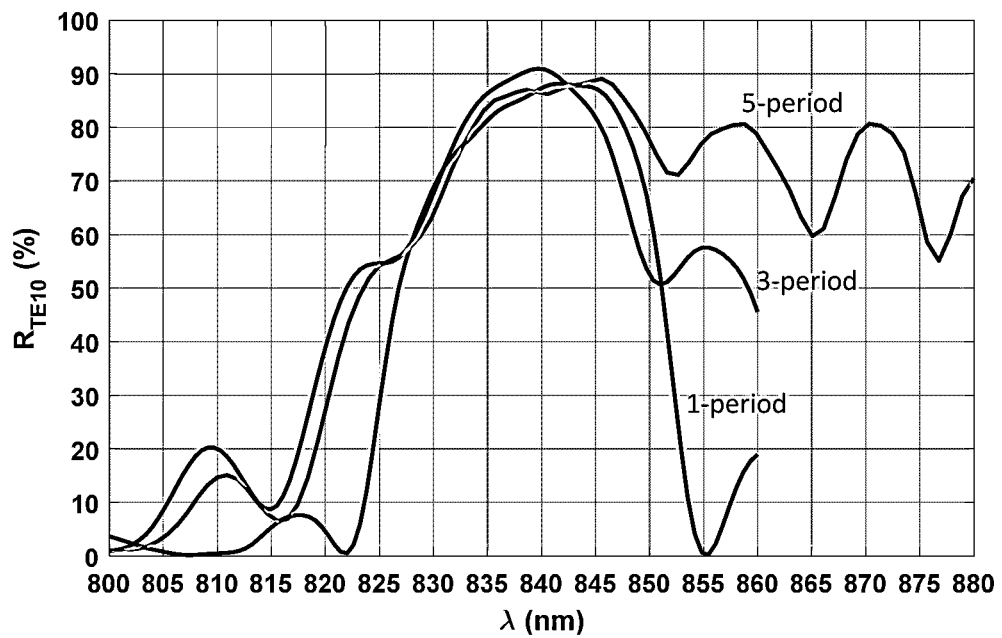
FIG. 18 is a graph showing reflectivity of Bragg grating configurations as shown in FIGS. 16 and 17.

In FIG. 18, a graph shows reflectivity performance for the multiple-period gratings shown in FIGS. 16 and 17 compared to a single-period grating. The five-period reflector can increase the reflection bandwidth, but length of the Bragg reflector along the light propagation direction could be double the size of 1-period reflector. This may be an issue for some embodiments, e.g., where the grating is close to the NFT as shown in FIG. 3. In other embodiments, e.g., where the grating is between a mode converter and input end of the waveguide as shown in FIG. 12, then the grating length may be less of an issue.

Figure 19:
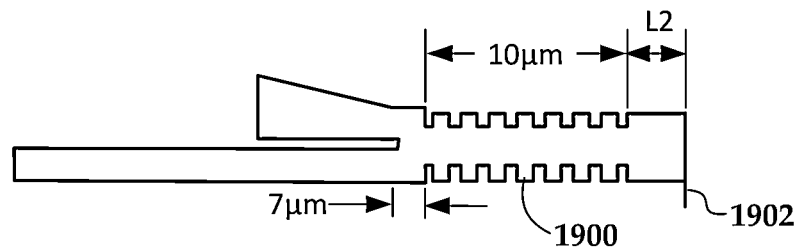
FIG. 19 is a diagram of a Bragg grating according to another example embodiment.
Figure 20A:
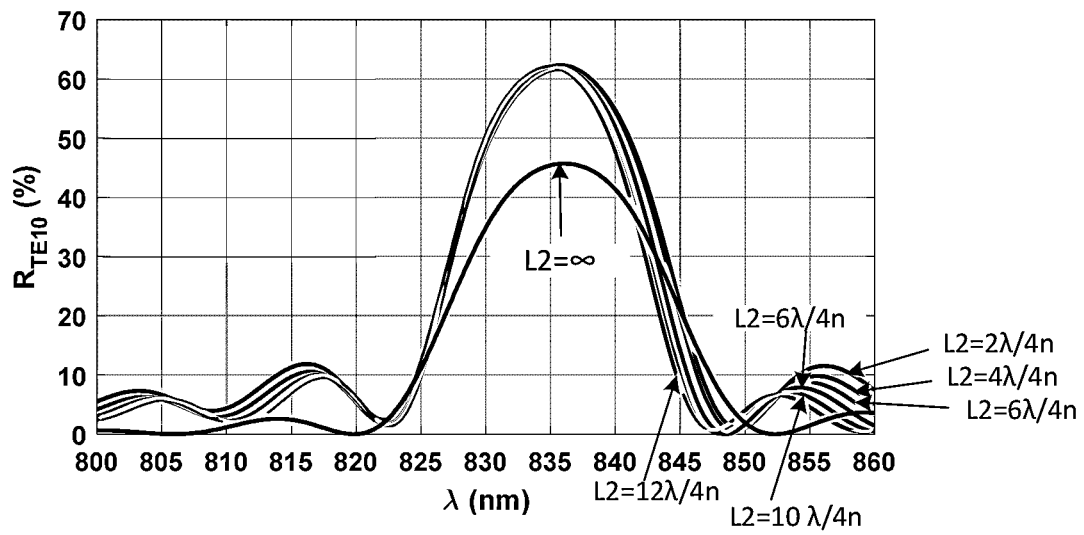
FIGS. 20A and 20B are graphs showing the effects on reflectivity responsive to changing dimensions on the distance L2 of the Bragg grating from the media-facing surface as shown in FIG. 19.
Figure 20B:
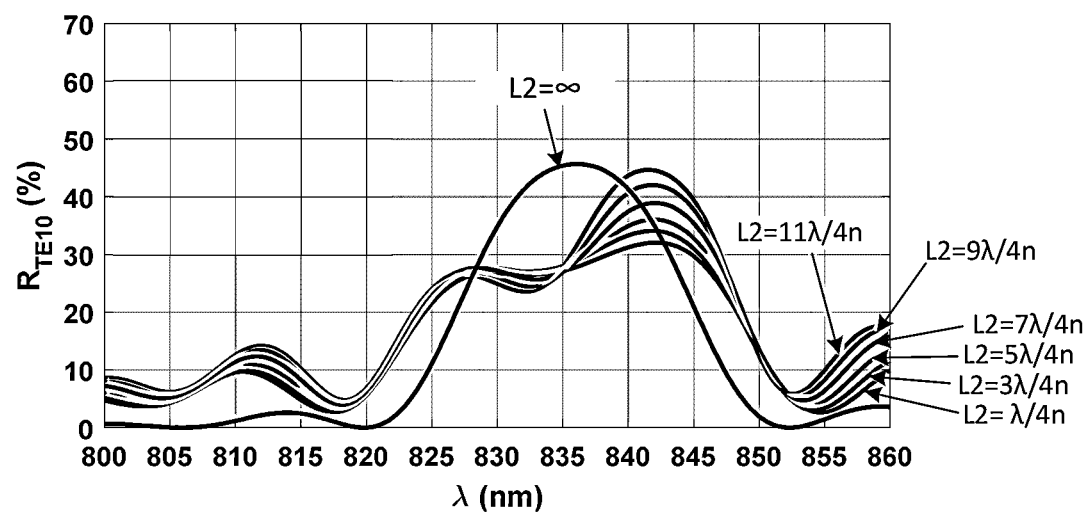

Another factor for consideration of a Bragg grating is distance from features between the grating and the media-facing surface. In embodiments where the grating is close to the NFT, e.g., as shown in FIG. 3, this distance is between the media-facing surface and an end of the grating closest to the media-facing surface. In FIG. 19, a diagram shows dimensions of this type of grating 1900 according to an example embodiment. In FIGS. 20A and 20B, graphs show the effect of different values of L2 on reflectivity. For multi-period and single-period TE10 reflector, for best performance at wavelength $\lambda$, the distance L2 between the media-facing surface 1902 and the first tooth/peak of the grating, as shown in FIG. 20A, are preferably even multiple of $\sim\lambda/(4\,n)$ from the ABS, where n is the effective index of the waveguide mode and the multiplication factor of $\lambda/(4\,n)$ ranges from 0 to ~40, e.g., 2 m$\lambda/(4\,n)$ where m is an integer, $0 \le m \le 21$. However, if the criteria is wider bandwidth and lower reflection, then the distance can to be $(2\,m+1)\lambda/(4\,n)$ where m is an integer, $0 \le m \le 20$ as shown in FIG. 20B.

Figure 21:
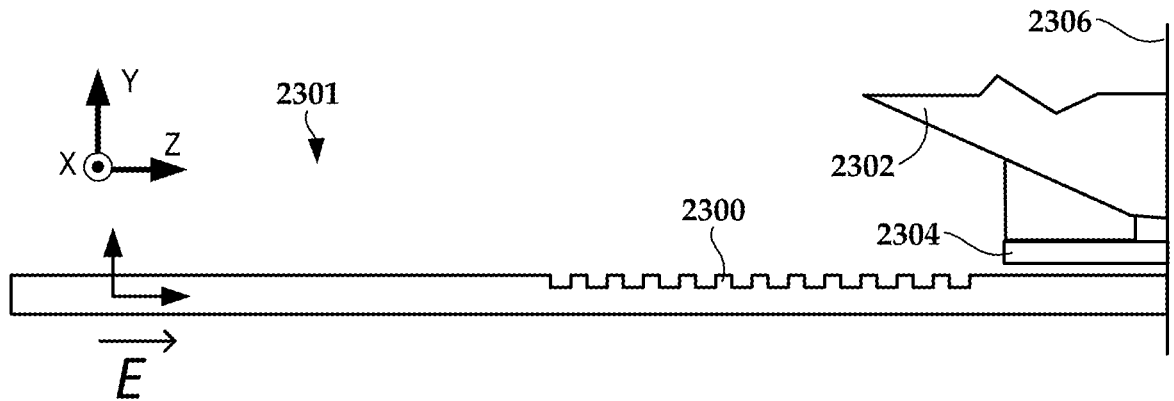
FIGS. 21-23 are diagrams of Bragg gratings suitable for a transverse magnetic external cavity laser according to example embodiments.
Figure 22:
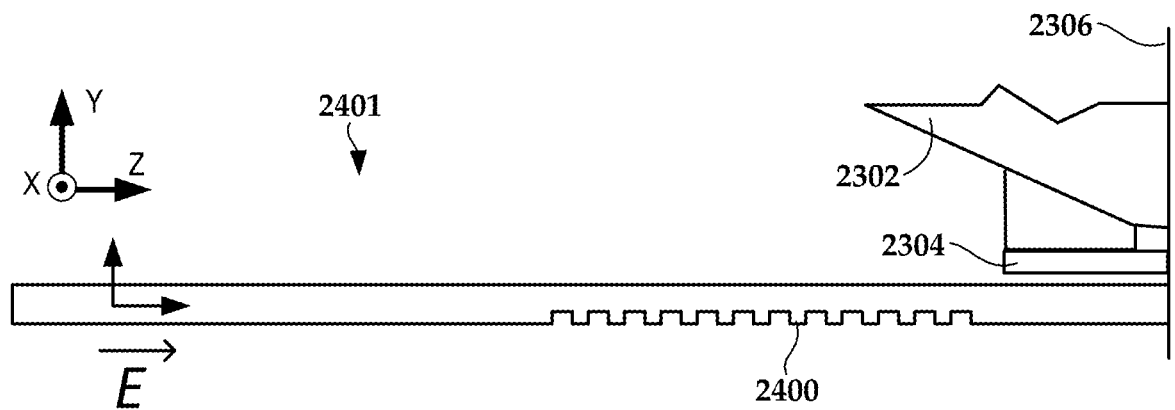
Figure 23:
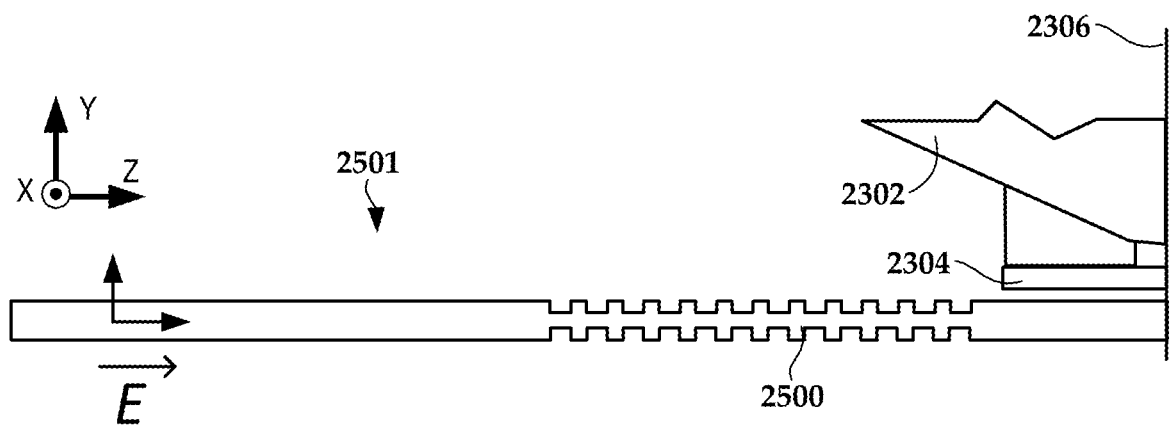

The embodiments shown above can be used in an external cavity laser that is excited in the waveguide in a TE mode. In other embodiments, a transverse magnetic (TM) mode may be used instead. Such a configuration may utilize a different style of NFT than a TE mode light coupling path, however an external cavity laser may still be utilized in such a configuration. In FIGS. 21-23, a cross-sectional view shows an example of TM mode channel waveguides usable with an external cavity laser according to example embodiments. Waveguides 2301, 2401, 2501 include respective Bragg gratings 2300, 2400, 2500 that are on one or more downtrack sides of the waveguide (corresponding to substrate-parallel planes that bound the waveguide core). This location is selected due to the polarization being perpendicular to the waveguide plane (xz-plane in this example, which corresponds to the wafer plane). In all of the drawings, an output end of the waveguide 2301, 2401, 2501 is proximate an NFT 2304 and write pole 2302 at a media-facing surface 2306. The distance from media facing surface 2306 to first tooth of gratings 2300, 2400, 2500 will preferably be at an even multiple of $\sim\lambda/(4\,n)$, where the multiplication factor of $\lambda/(4\,n)$ ranges from 0 to ~40, in even numbers.

Grating 2300 has serrations facing the NFT 2304, grating 2400 has serrations facing away from the NFT 2304, and grating 2500 has gratings both facing towards and away from the NFT 2304. While these gratings 2300, 2400, 2500 are oriented differently than other embodiments, a TM-type grating may also incorporate previously described grating features, including different serration shapes, gratings two or parts with different periodicity, location before or after a mode converter (assuming a mode converter is used), etc. Also note that the waveguides 2301, 2401, 2501 would be used with an externally mounted part with an active lasing region, e.g., such as external part 106a in FIG. 2, but with the active region emitting light in a TM mode relative to the waveguide or external part 106a in FIG. 2 would emit TE, but instead of mode-converter 106b there could be a polarization rotator in the external cavity to rotate TE-polarized light to TM-polarized light.

In FIGS. 24 and 25, diagrams illustrate Bragg grating configurations that may be used with an external cavity laser according to other example embodiments. Waveguides 2600, 2700 each include multiple grating sections. Waveguide 2600 has two grating sections 2602-2603 separated by cavity 2608 and waveguide 2700 has grating sections 2702-2704 separated by cavities 2708-2709. Waveguides 2600, 2700 also have respective output ends 2604, 2705, input ends 2606, 2706, and mode converters 2610, 2710.

For purposes of these embodiments, the output ends 2604, 2705 may also be considered cavities, e.g., sections of wavelength without serrations that are located at one end of a set of serrations. The lengths of the cavities 2608, 2708, 2709 and output ends 2604, 2705 in the light propagation direction will preferably be equal to integral multiples of quarter-wavelength ($\lambda/(4\,n)$). This enables 'controlled mode-hopping' between adjacent cavities 2608, 2708, 2709 and output ends 2604, 2705, but the power fluctuation caused by these 'controlled mode-hops' would be designed to be within specifications such that impact to laser performance can be managed.

In FIG. 26, a diagram shows additional features of an external cavity laser according to an example embodiment. In this embodiment, a channel waveguide 2800 of the laser includes a Bragg grating 2802 at one end. A heater 2804 covers part of all of the grating 2802, e.g., being formed on a layer above and/or below the grating 2802, and/or on the same layer but surrounding the perimeter of the grating 2802. The heater 2804 may include a material of high thermal conductivity whose temperature is controlled via one more heating elements 2806. In this example, the heating element 2806 is shown as a resistive heater, but other heater elements may be used, e.g., optical, inductive, etc. The heating element 2806 is coupled via conductors 2807, 2808 to a controller 2810.

Generally, the heater 2804 may be selectively controlled by controller 2810 to tune the grating 2802, e.g., to adjust the reflectivity and/or transmissivity of the grating 2802 to a particular center wavelength. The heater 2804 can be used to vary the thermo-optic coefficient of the grating material to shift the resonance wavelength of the gratings and hence help in stabilizing the power of the laser traveling through the waveguide 2800. The heater 2804 may also induce thermal expansion or contraction of the grating 2802 along the light propagation direction, which can alter the periodicity of the serrations thereby affecting the resonance wavelength as well.

The controller 2810 may apply currents to the heating element 2806 based on an open loop model, e.g., applying a predetermined current based on a current operating mode or condition of the device. In other embodiments, one or more sensors 2812 may be coupled to the controller 2810 to provide more direct readings of the performance of the grating 2802 within the laser. The sensor 2812 may detect light intensity, local temperature, mechanical strain, etc. This can be used to provide closed-loop control of the grating in order to detect and counter mode-hop instability. This type of heater may be used with any other embodiments described herein, including those configured for TM coupling, gratings having different serration shapes, gratings located before or after a mode converter, gratings with multiple sets of serrations of different periodicity, gratings with multiple sets of serrations separated by cavities, etc.

Figure 27:
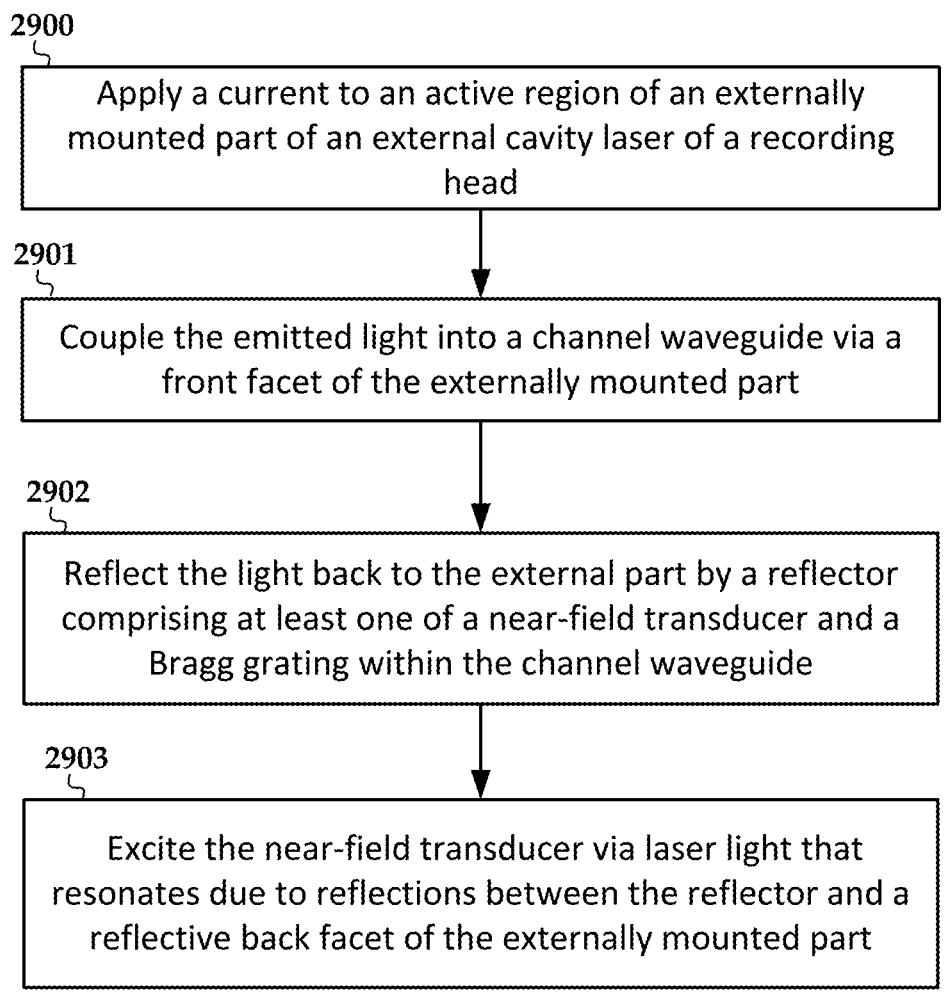
FIG. 27 is a flowchart of a method according to an example embodiment.

In FIG. 27, a flowchart shows a method according to an example embodiment. The method involves applying 2900 a current to an active region of an externally mounted part of an external cavity laser of a recording head. The active region emits light from anti-reflective front facet. The emitted light couples 2901 into a channel waveguide via the front facet, the channel waveguide towards a media-facing surface of the recording head. The light is reflected 2902 back to the external part by a reflector comprising at least one of a near-field transducer proximate to a media-facing surface and a Bragg grating within the channel waveguide. For example, where no more than 15% reflection is needed, the near-field transducer alone may suffice. The near-field transducer is excited 2903 via laser light that resonates due to reflections between the reflector and a reflective back facet of the external part.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. An external cavity laser of a recording head, comprising:
a channel waveguide that delivers light towards a media-facing surface of the recording head;
an externally mounted part comprising an active region having a longitudinal axis corresponding to a light propagation direction of the channel waveguide, the externally mounted part comprising a reflective back facet and anti-reflective front facet; and
a near-field transducer at an end of the channel waveguide proximate the media facing surface, the near-field transducer comprising a plate structure and a peg extending from the plate structure towards the media-facing surface, the reflective back facet and the near-field transducer defining a resonator of the external cavity laser, wherein the near-field transducer reflects no more than 15% of the light back towards the externally mounted part.

2. The external cavity laser of claim 1, further comprising a Bragg grating within the channel waveguide and having a longitudinal axis defined along the light propagation direction, the Bragg grating located proximate the near-field transducer so that the Bragg grating and near-field transducer function together as a reflector of the resonator of the external cavity laser, the reflector reflecting more than 15% of the light back towards the externally mounted part.

3. The external cavity laser of claim 2, wherein the Bragg grating is separated from the near-field transducer by 5 μm or less.

4. The external cavity laser of claim 2, wherein the channel waveguide delivers the light in a transverse electric mode, and wherein the Bragg grating comprises serrations on opposing crosstrack sides of a core of the channel waveguide.

5. The external cavity laser of claim 4, wherein the serrations are at least one of rectangular and sinusoidal.

6. The external cavity laser of claim 4, wherein the serrations comprise at least two sets of serrations having different periodicity.

7. The external cavity laser of claim 4, wherein the serrations comprise at least two sets of serrations separated by a cavity without serrations.

8. The external cavity laser of claim 2, wherein the channel waveguide delivers the light in a transverse magnetic mode, and wherein the Bragg grating comprises serrations on opposing downtrack sides of a core of the channel waveguide.

9. The external cavity laser of claim 2, further comprising a heater proximate the Bragg grating, the heater operable to shift a resonance wavelength of the Bragg grating in response to a controller input.

10. An external cavity laser of a recording head, comprising:
a channel waveguide that delivers light towards a media-facing surface of the recording head;
an externally mounted part comprising an active region having a longitudinal axis corresponding to a light propagation direction of the channel waveguide, the externally mounted part comprising a reflective back facet and anti-reflective front facet;
a near-field transducer at an end of the channel waveguide proximate to a media-facing surface; and
a Bragg grating within the channel waveguide and having a longitudinal axis defined along the light propagation direction, the Bragg grating separated from the near-field transducer by 5 μm or less.

11. The external cavity laser of claim 10, wherein the near-field transducer comprises a plate structure and a peg extending from the plate structure towards the media-facing surface.

12. The external cavity laser of claim 10, wherein Bragg grating and the near-field transducer function as a reflector, the reflective back facet and the reflector defining a resonator of the external cavity laser.

13. The external cavity laser of claim 10, wherein the channel waveguide delivers the light in a transverse electric mode, and wherein the Bragg grating comprises serrations on opposing crosstrack sides of a core of the channel waveguide.

14. The external cavity laser of claim 13, wherein the serrations are rectangular or sinusoidal.

15. The external cavity laser of claim 13, wherein the serrations comprise at least two sets of serrations having different periodicity.

16. The external cavity laser of claim 13, wherein the serrations comprise at least two sets of serrations separated by a cavity without serrations.

17. The external cavity laser of claim 10, wherein the channel waveguide delivers the light in a transverse magnetic mode, and wherein the Bragg grating comprises serrations on opposing downtrack sides of a core of the channel waveguide.

18. The external cavity laser of claim 10, further comprising a heater proximate the Bragg grating, the heater operable to shift a resonance wavelength of the Bragg grating in response to a controller input.

19. The external cavity laser of claim 10, wherein the Bragg grating being separated from the near-field transducer by 5 µm or less results in a mode hop spacing of approximately 36 nm or less.

* * * * *